United States Patent
Kamali et al.

(10) Patent No.: US 11,187,994 B2
(45) Date of Patent: Nov. 30, 2021

(54) METHOD FOR CONTROLLING A MANUFACTURING PROCESS AND ASSOCIATED APPARATUSES

(71) Applicant: ASML NETHERLANDS B.V., Veldhoven (NL)

(72) Inventors: Mohammad Reza Kamali, Eindhoven (NL); Brennan Peterson, Longmont, CO (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/264,023

(22) PCT Filed: Jul. 3, 2019

(86) PCT No.: PCT/EP2019/067858
§ 371 (c)(1),
(2) Date: Jan. 28, 2021

(87) PCT Pub. No.: WO2020/035211
PCT Pub. Date: Feb. 20, 2020

(65) Prior Publication Data
US 2021/0311400 A1 Oct. 7, 2021

(30) Foreign Application Priority Data
Aug. 16, 2018 (EP) .................................. 18189305.8

(51) Int. Cl.
*G03F 7/20* (2006.01)
(52) U.S. Cl.
CPC ...... *G03F 7/70533* (2013.01); *G03F 7/70525* (2013.01); *G03F 7/70625* (2013.01); *G03F 7/70633* (2013.01)

(58) Field of Classification Search
CPC ............. G03F 7/70533; G03F 7/70525; G03F 7/70625; G03F 7/70633
See application file for complete search history.

(56) References Cited

U.S. PATENT DOCUMENTS

| 2006/0033921 A1 | 2/2006 | Den Boef et al. |
| 2006/0066855 A1 | 3/2006 | Den Boef et al. |

(Continued)

FOREIGN PATENT DOCUMENTS

| TW | 201723670 | 7/2017 |
| TW | 201742115 | 12/2017 |

(Continued)

OTHER PUBLICATIONS

International Search Report and Written Opinion issued in corresponding PCT Parent Application No. PCT/EP2019/067858, dated Oct. 30, 2019.

(Continued)

*Primary Examiner* — Steven Whitesell Gordon
(74) *Attorney, Agent, or Firm* — Pillsbury Winthrop Shaw Pittman LLP

(57) ABSTRACT

A method for controlling a manufacturing process for manufacturing semiconductor devices, the method including: obtaining performance data indicative of the performance of the manufacturing process, the performance data including values for a performance parameter across a substrate subject to the manufacturing process; and determining a process correction for the manufacturing process based on the performance data and at least one control characteristic related to a dynamic behavior of one or more control parameters of the manufacturing process, wherein the determining is further based on an expected stability of the manufacturing process when applying the process correction.

20 Claims, 3 Drawing Sheets

(56) References Cited

U.S. PATENT DOCUMENTS

| | | | |
|---|---|---|---|
| 2007/0050749 A1* | 3/2007 | Ye | G03F 7/70641 430/30 |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2012/0008127 A1* | 1/2012 | Tel | G03F 7/70516 355/77 |
| 2012/0044470 A1 | 2/2012 | Smilde et al. | |
| 2012/0123581 A1 | 5/2012 | Smilde et al. | |
| 2012/0303151 A1 | 11/2012 | Ye et al. | |
| 2013/0258310 A1 | 10/2013 | Smilde et al. | |
| 2013/0271740 A1 | 10/2013 | Quintanilha | |
| 2018/0024054 A1 | 1/2018 | Moon et al. | |
| 2018/0059552 A1 | 3/2018 | Pandey | |
| 2018/0284621 A1 | 10/2018 | Hulsebos et al. | |
| 2019/0072857 A1 | 3/2019 | Kupers et al. | |
| 2019/0146358 A1 | 5/2019 | Jochemsen et al. | |

FOREIGN PATENT DOCUMENTS

| | | |
|---|---|---|
| TW | 201805731 | 2/2018 |
| TW | 201812473 | 4/2018 |
| TW | 201818051 | 5/2018 |
| WO | 2009078708 | 6/2009 |
| WO | 2009106279 | 9/2009 |
| WO | 2013178422 | 12/2013 |
| WO | 2019052747 | 3/2019 |

OTHER PUBLICATIONS

Taiwanese Office Action issued in corresponding Taiwanese Patent Application No. 108125637, dated May 26, 2020.

* cited by examiner

METHOD FOR CONTROLLING A MANUFACTURING PROCESS AND ASSOCIATED APPARATUSES

CROSS-REFERENCED TO RELATED APPLICATIONS

This application is the U.S. national phase entry of PCT Patent Application No. PCT/EP2019/067858, which was filed on Jul. 3, 2019, which is based upon and claims the benefit of priority of European Patent Application No. 18189305.8, which was filed on Aug. 16, 2018, each of which is incorporated herein in its entirety by reference.

BACKGROUND

Field of the Invention

The present invention relates to methods and apparatus for control of a manufacturing processes which include applying patterns to a substrate in a lithographic process.

Background

A lithographic apparatus is a machine that applies a desired pattern onto a substrate, usually onto a target portion of the substrate. A lithographic apparatus can be used, for example, in the manufacture of semiconductors (e.g., integrated circuits ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process. It would be desirable to improve such process control methods.

SUMMARY OF THE INVENTION

In a first aspect of the invention, there is provided a method for controlling a manufacturing process for manufacturing semiconductor devices, the method comprising: obtaining performance data indicative of the performance of the manufacturing process, the performance data comprising values for a performance parameter across a substrate subject to the manufacturing process; and determining a process correction for the manufacturing process based on the performance data and at least one control characteristic related to a dynamic behavior of one or more control parameters of the manufacturing process, wherein the determining step is further based on an expected stability of the manufacturing process when applying the process correction.

In a second aspect of the invention, there is provided a processing device for controlling a manufacturing process for manufacturing semiconductor devices, the processing device being configured to perform the method of the first aspect.

In a third aspect of the invention, there is provided a semiconductor device manufacturing apparatus comprising: a lithographic apparatus; an etch apparatus; and the processing device of the second aspect; wherein said semiconductor device manufacturing apparatus is configured to provide product structures to a substrate in a manufacturing process for manufacturing semiconductor devices.

In a fourth aspect of the invention, there is provided a computer program comprising program instructions operable to perform the method of the first aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
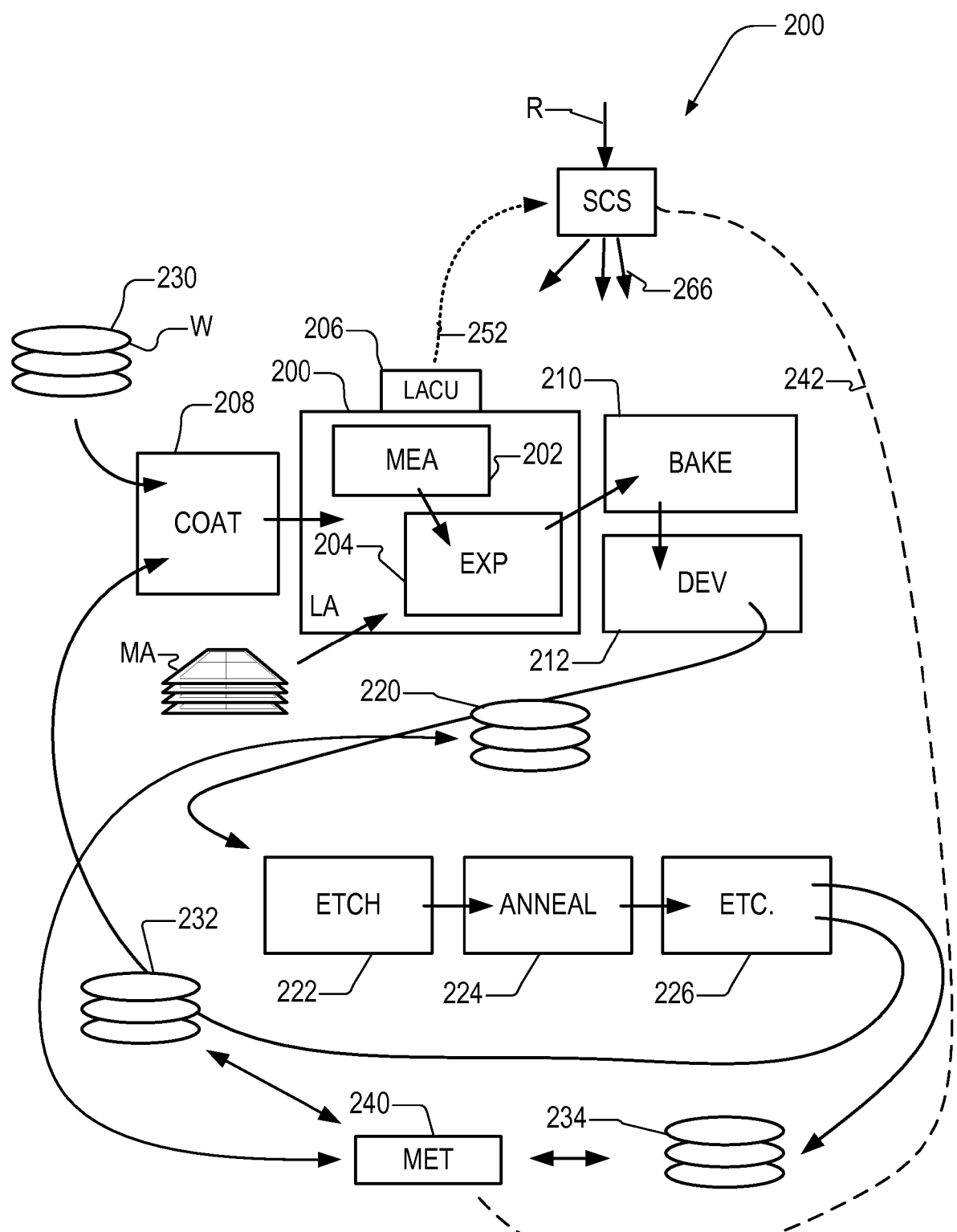
FIG. 1 depicts a lithographic apparatus together with other apparatuses forming a production facility for semiconductor devices.
Figure 2:
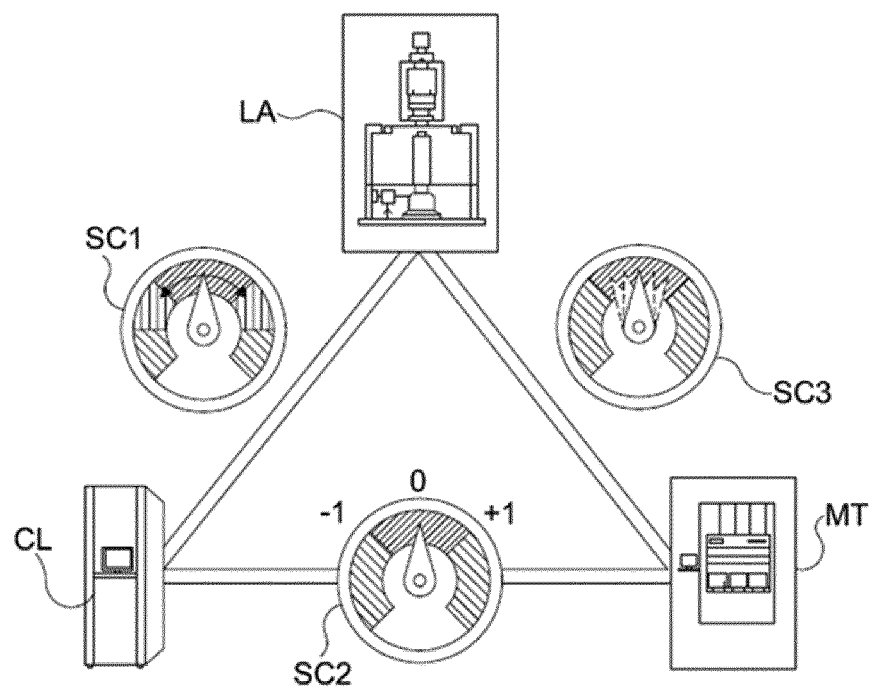
FIG. 2 depicts a schematic representation of holistic lithography, representing a cooperation between three key technologies to optimize semiconductor manufacturing.

FIG. 1 at 200 shows a lithographic apparatus LA as part of an industrial production facility implementing a high-volume, lithographic manufacturing process. In the present example, the manufacturing process is adapted for the manufacture of for semiconductor products (semiconductors) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example be a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Another type of metrology apparatus which may be used (alternatively to or complementary with scatterometer based tools) are scanning electron microscope (SEM) or electron beam (e-beam) metrology tools. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay, CD, CDU (critical dimension uniformity), LWR (line width roughness) or Edge Placement Error (EPE), which is essentially a measure of the combined effect of overlay and CDU.

Figure 3:
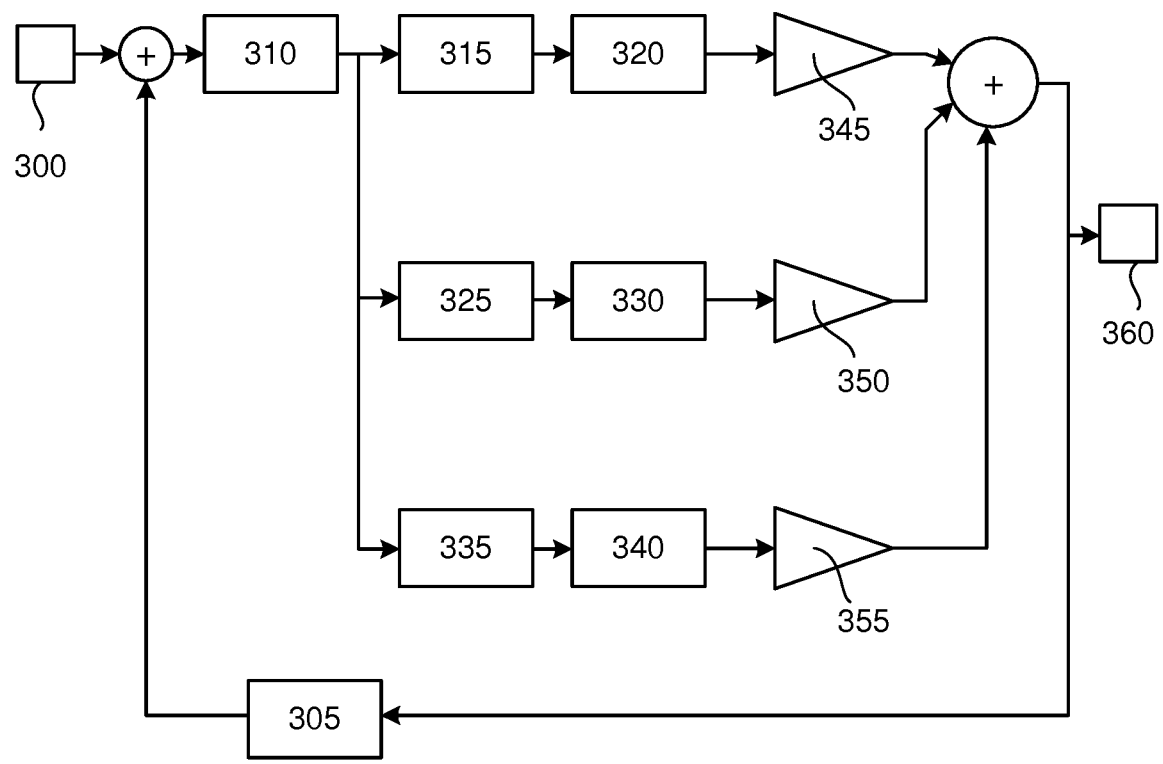
FIG. 3 is a conceptual flow of a process control method according to an embodiment of the invention.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window.

The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Control of the lithographic process is typically based on measurement results fed back or fed forward and then modelled using, for example interfield (across-substrate fingerprint) or intrafield (across-field fingerprint) models. The lithographic control is typically performed using offline calculation of one or more set-point process corrections for one or more particular control degrees of freedom, based on (for example) measurements of previously formed structures. The set-point process corrections may comprise a process correction for a particular process parameter, and may comprise the process correction of a setting of a particular degree of freedom to compensate for any drift or error such that the measured process parameter remains within specification (e.g., within an allowed variation from a best setpoint or best value; for example, process window). For example, an important process parameter is overlay, and an overlay error may manifest itself in a defective structure being formed on a substrate. In a typical overlay control loop, an overlay feedback methodology may be used. Such a methodology may comprise a metrology step which may measure overlay on previously exposed substrates. The measured overlay may then be used to determine a process correction for the lithographic process; for example a positional process correction for one or both of the reticle stage or substrate stage which corrects for the overlay error. Such positional process correction may then be conveyed to the scanner as a set-point process correction, for direct actuation by the scanner.

In addition to the accuracy of the determined process corrections, another important aspect is the stability of the process after implementing the process corrections. It is therefore proposed that a process controller determines process corrections while also taking into account the stability of the process when applying the process correction (or control recipe incorporating the process correction). To achieve this, it is proposed that, in addition to the spatial behavior, an expected dynamic potential (temporal behavior) of the process correction is considered when determining the process correction. This requires knowledge, for example, of particular dynamic capabilities of control aspects of the relevant processes, e.g., a control parameter reaction time (i.e., how fast the process can react to a change of a control parameter setting), in addition to other factors such as, for example, the achievable process correction range across a certain spatial scale (granularity of process correction).

The above description, and many typical IC manufacturing control strategies, implement control via control parameters of the lithographic apparatus (scanner). However, other processing tools, for example the etch tool, may also play an important role in on-product performance. Using present control capabilities of the lithographic tool only, a number of dynamic processing tool induced errors remain uncorrected. Furthermore, present control techniques tend to be limited by using the difference between the after-etch inspection (AEI) fingerprint and after-develop inspection (ADI) fingerprint (pre-etch) in the control loop. It is envisaged that the methods described herein may, in an embodiment, also take into account the other control capabilities (such as deposition tool, development tool and etch tool control parameters) of the process. Implementing control via other process control parameters, such as metrology control parameters, can also have a positive impact on the overall process. As such, the determined process corrections may be related to one or more of: scanner control parameters, etch tool control parameters, metrology control parameters (e.g., sampling schemes), or any other control parameters (e.g., track control, deposition control etc.) which may have an effect on a performance parameter (e.g., a KPI (Key Performance Indicator) such as overlay, CDU, LWR, EPE) in a semiconductor (IC) manufacturing process. Determined process corrections may, in an embodiment, be co-optimized for two or more of these types of control parameters. As such, it is envisaged that a time varying control strategy for a performance parameter may be devised based on selected processing tool and/or lithography control parameters (at least). In this way, the control strategy can benefit from the synergy between scanner and processing tool control characteristics. For example, scanner control may tend to have higher spatial/temporal frequency characteristics compared to etch control characteristics. Additionally, etch control may be more effective than scanner control for certain substrate regions (e.g., edge regions).

Processing tool control (such as etch tool) parameters are important as numerous processes may induce pattern asymmetry in product features, alignment marks and overlay marks. These asymmetries affect EPE through errors in Overlay, CD and LWR due to the following equation:

$$EPE = \mu_{EPE} + 3\sigma_{EPE} = \frac{HR_{OPC}}{2} + \frac{3\sigma_{PBA}}{2} + \frac{6\sigma_{Local}}{\sqrt{2}} + \sqrt{(3\sigma_{overlay})^2 + \left(\frac{3\sigma_{CDU\_L}}{2}\right)^2}$$

where $\sigma_{EPE}$, $\sigma_{overlay}$, $\sigma_{PBA}$, $\sigma_{CDU\_L}$, $\sigma_{local}$ is the standard deviation of EPE, overlay, proximity bias average, line CDU and local errors due to resist and photon stochastics (which mainly affect LWR), respectively; $\mu_{EPE}$ is the mean of the EPE; and $HR_{OPC}$ is the half-range of the CD error due to optical proximity residuals.

There are a number of (scanner and processing apparatus) control parameters which can be varied to actuate performance parameter (e.g., EPE) process corrections. These include for example for a scanner apparatus: focus, dose, laser bandwidth of a source, control of projection system aberrations and control of the substrate stage (for overlay control). Of these variables, some are the tool's set points and some are locally tunable variables. However, the impacts of these variables are mainly observed in local EPE. Each control parameter impacts the EPE contributors differently, the main EPE contributors are the performance parameters: overlay, CD/CDU and LWR. Substrate stage control and dose control are variables which mainly affect overlay and CD respectively. Laser bandwidth control affects the contrast of imaging which is expected to have a relationship with LWR. Focus and projection system (odd) aberration control impact CD and overlay respectively. The combined effects (e.g., of different pairs) of these control parameters also show different relationships with a particular performance parameter.

In a specific embodiment, therefore, it is proposed to control EPE by estimating an expected stability of the resultant controlled process when determining a process correction for the process. For example, the control strategy may be such that only process corrections which meet a stability threshold will be implemented. Alternatively, process corrections which have been determined to have a similar impact on EPE may be characterized by their expected stability such that the most stable is chosen. Such an embodiment may comprise selecting a process correction from a number of process corrections all of which meet control specification limits for the performance parameter, based on the expected stability (and possibly also to maximize residual control as will be described). Alternatively, a control recipe which implements a process correction that meets the control specification limits may be modified to optimize its stability while still ensuring the control limits are met. Alternatively, or in addition, a co-optimization for process correction (meeting the control limits) and stability is performed.

The control may be implemented via any suitable control parameters, such as scanner parameters, and/or other process parameters. In a particular embodiment, a co-optimized scanner control is proposed.

In an embodiment, such a control may be implemented as a control layer or interface. Such a control layer may be operable to ensure that EPE fingerprints meet control limits. According to an embodiment, the control layer receives data comprising: i) performance parameter values (e.g., metrology data) indicative of EPE (e.g., overlay, CD, CDU, LCDU, LWR, ii) spatial fingerprint information, and iii) dynamics (expected temporal behavior of the control parameters). In an embodiment, the control interface may be anonymous such that the control of the relevant apparatuses (e.g., etcher and/or scanner) is implemented in terms of the control (EPE) components. Control components may comprise, for example, one or more of: an overlay component, a CD component, a CDU component, an LCDU component and an LWR component.

The control layer distributes control based on (known) control characteristics of the respective apparatus used in the semiconductor manufacturing flow. The control characteristics may comprise an achievable process correction range across a certain spatial scale (granularity of correction) and a dynamic range of the process correction (how fast corrections can be adjusted).

In an optional embodiment, the control layer may be configured to favor control solutions which maximize residual control potential; i.e., solutions which leave further scope to correct for (expected or unexpected) future process fluctuations or drift. Therefore, some present stability may be traded for future control potential to optimize future stability by ensuring that further process correction for future instable behavior is possible. For example, a control solution may be estimated to have a very high expected stability, but might require control of all the highly reactive (high speed) control parameters such that there is very little additional capacity to react to future events. Such a solution may be rejected in favor of an alternative which provides greater scope for additional process correction, at the cost of a slightly less optimal estimated stability.

In an optional embodiment, the control layer may determine and distribute sampling schemes to metrology tools, which are optimized in terms of an expected stability of process corrections implemented using the measurement scheme. Such an embodiment may include determining a sampling scheme for ADI metrology (e.g., using a scatterometry based tool) with a first measurement frequency and/or determining a sampling scheme for AEI metrology (e.g., using an SEM type tool) with a second measurement frequency.

Mathematically, the control layer determines values for the control parameters based on an expected improvement of a performance parameter (e.g., EPE or a component thereof), and how stable this improvement will be (e.g. how robust the control strategy is to temporal and spatial behavior of processes affecting the EPE).

Alternatively, instead of targeting improvement of the EPE also the tilt of a feature provided to the substrate may be the subject of the control layer. Values of the control parameters may be then determined by the control layer to achieve a stable control strategy target for minimizing tilt errors of features. Such a tilt error may be for example a deviation of an etching path from a normal to the substrate, as disclosed in the international patent application WO2019052747A1, which is herein incorporated by reference in its entirety. Control parameters suitable to tilt control may be for example control parameters of an etch apparatus (electric field control), deposition apparatus or a lithographic apparatus (overlay control arranged to compensate the tilt error).

A combination of different control parameters may be defined for each control component; e.g., an overlay component for optimizing overlay, a CD component for optimizing CD, and an LWR component for optimizing LWR etc. In an embodiment, these control components may be divided into different scanner components as illustrated in FIG. 3. The final EPE value, therefore will be a function of these components.

FIG. 3 is a conceptual process flow according to an embodiment. A performance parameter (e.g., EPE) setpoint 300 and performance data (e.g., metrology data such as measured EPE values) 305 are fed into a PID controller 310. The PID controller controls the process to minimize the error between the setpoint value 300 and the performance data 305 by varying the control components 315-340, which comprise in this example: scanner overlay component 315, scanner CD component 325, scanner LWR components 335, processing apparatus overlay component 320, processing apparatus CD component 330 and processing apparatus LWR component 340. The gain weighting between the control components is set by overlay gain amplifier 345, CD gain amplifier 350 and LWR gain amplifier 355. The effects of each of the determined process corrections are combined to estimate the controlled performance parameter (EPE) 360 (i.e., the performance parameter with process corrections applied). This estimation also considers the expected stability of the process correction. The process corrections are optimized for a minimal EPE, but which is also relatively stable over time. The performance data 305 may comprise on-product measurement of EPE (e.g., using an SEM type tool), and the subsequent process correction may be applied on per-lot or per-substrate basis. The time constant of the PID controller 310 and individual control parameters may be calibrated depending on the use case and its feature and process dependencies.

Scanner overlay component 315 for example, may comprise a lithography scanner overlay optimizer which optimizes the scanner capability for correction of lithography and process impact on the substrate. This control interface improves the scanner capabilities in maintaining desired overlay through an update of alignment and overlay correction sets. The overlay corrections can be fed to the scanner through high order corrections per exposure (CPE). The high order CPE functionality is particularly beneficial to correct defects due to process fingerprints with high spatial frequency, observed on particular regions on the substrate. The alignment corrections may be aided by local alignment modeling. This local alignment functionality is particularly beneficial for high wafer-to-wafer variation, or when process fingerprints affect the wafer edge. Combining the application of the high-order CPE (HO-CPE) overlay correction and the local alignment strategy can improve overlay performance at substrate regions having high spatial frequency errors.

The corresponding scanner components (e.g., components 315 and 320) should be synchronized to optimize performance on the substrate with acceptable spatial and temporal resolution.

More specifically, each of these control components may be described in terms of a combined impact $Y_n$ of individual control parameters $x_i$ on the final response of a particular performance parameter, where the subscript n identifies the performance parameter (e.g., n=1 is overlay, n=2 is CD and n=3 is LWR). In a specific example with five control parameters i=1-5, such a control component may take the form:

$$Y_n = a_n x_1 + b_n x_2 + c_n x_3 + d_n x_4 + e_n x_5 + x_1(f_n x_2 + g_n x_3 + h_n x_4 + i_n x_5) + x_2(j_n x_3 + k_n x_4 + l_n x_5) + x_3(m_n x_4 + n_n x_5) + x_4(q_n x_5)$$

Therefore, by using the correction potential $a_n$-$q_n$ of individual control parameters, the combined impact $Y_1$-$Y_3$ of the control parameters can be calculated. In a specific embodiment for example, the control component may be a scanner control component and parameters $x_1$-$x_5$ may comprise scanner control parameters; e.g., respectively: substrate stage (position, velocity, acceleration), dose, focus, projection system aberrations, laser bandwidth. Another processing apparatus control parameter could be included as well.

Figure 4:
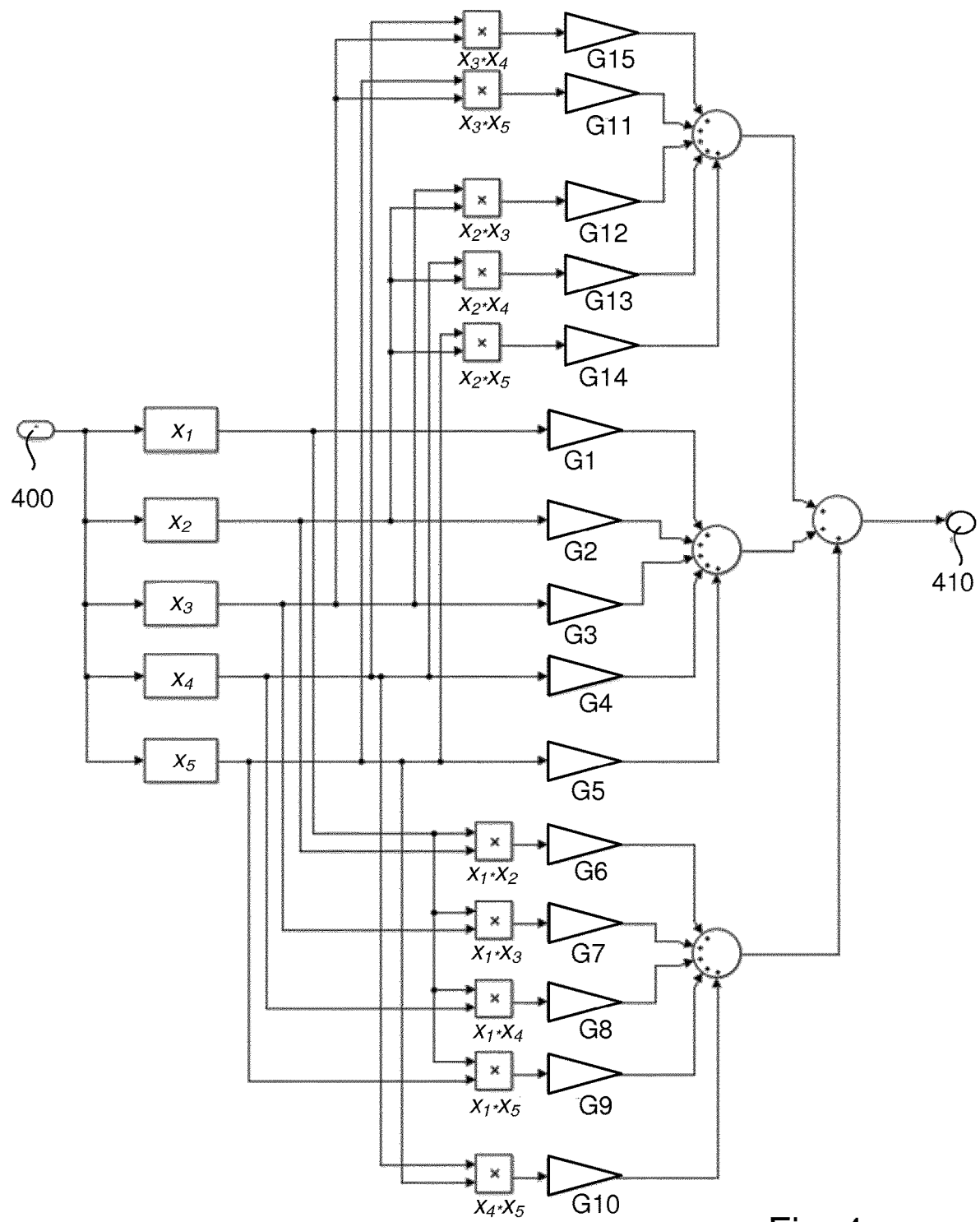
FIG. 4 is a conceptual flow of a control component of the process control method of FIG. 3.

FIG. 4 is a schematic illustration of the control component described by the equation of the preceding paragraph; more specifically a schematic illustration of the scanner overlay component 315. This figure describes control of the scanner via parameters $x_1$-$x_5$. The control component starts with an overlay setpoint 400 (i.e., $Y_1$) and ends with a corrected setpoint 410 (i.e., $Y_1'$). In addition to individual optimization of the control parameters $x_1$-$x_5$, the combined effect of different pairs of the control parameters are also optimized Gain amplifiers G1-G15 set the relative weights for different control parameters and control parameter pairs, i.e., the coefficients $a_1$-$q_1$.

Of particular note is that each of the control parameters $x_1$ has its own time-varying response function: $x_i = \alpha_i e^{-\alpha_i t} u_i(t)$. It is therefore proposed to use this time-varying response to estimate an expected stability, and use this expected stability when determining the control strategy. This could be achieved, for example, by using the time-varying response function in a PID (proportional-integral-derivative) controller (e.g., a PID closed-loop controller). Different control parameters have different time constants $\alpha_i$ depending on their nature, and an individual control signal $u_i(t)$ each having the form:

$$u(t) = K_P e(t) + K_I \int_0^t e(\tau) d\tau + K_D \frac{de(t)}{dt}$$

where $K_P$, $K_I$, $K_D$ are, respectively, the proportional, integral and derivative constants. A PID controller for the overall impact on EPE could follow the same function. Therefore, the effect of a process correction on a performance parameter (e.g., EPE) over time can be calculated. Unstable behavior will become apparent as an oscillation (for example) in the corrected performance parameter before settling on a final performance parameter (if it settles at all). The longer such oscillatory behavior is apparent, the more unstable the process correction. Therefore, process corrections which quickly settle on a performance parameter value will be preferred.

A process parameter process correction may, in an embodiment, bring a setpoint closer to a preferred value based on feedback (e.g., from metrology) in the manner already described. Alternatively, or in addition, the process parameter process correction may comprise a "dies-in-spec" optimization. This aims to maximize the number of dies that are within specification, rather than applying an averaged optimization across the substrate (e.g., a least-squares optimization based on a least squares minimization of the error residual).

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

Further embodiments of the invention are disclosed in the list of numbered embodiments below:

1. A method for controlling a manufacturing process for manufacturing semiconductor devices, the method comprising:

obtaining performance data indicative of the performance of the manufacturing process, the performance data comprising values for a performance parameter across a substrate subject to the manufacturing process; and determining a process correction for the manufacturing process based on the performance data and of at least one control characteristic related to one or more control parameters of the manufacturing process, wherein the determining step is further based on an expected stability of the manufacturing process when applying the process correction.

2. A method according to embodiment 1, wherein the control characteristic comprises a dynamic behavior of the one or more control parameters.

3. A method according to embodiment 2, wherein a PID controller is used to determine the process correction based on the dynamic behavior of the one or more control parameters.

4. A method according to embodiment 2 or 3, wherein the control characteristic further comprises the achievable correction range of the one or more control parameters.

5. A method according to any preceding embodiment, wherein each of the one or more control parameters has a corresponding time-varying response function, and said determining step takes into account each of said time-varying response functions.

6. A method according to any preceding embodiment, wherein the process correction attempts to maintain the performance parameter within specified bounds.

7. A method according to any preceding embodiment, wherein the process correction attempts to maximize the number of functional semiconductor devices per substrate.

8. A method according to any preceding embodiment, comprising the step of estimating the expected stability of the manufacturing process when determining said process correction.

9. A method according to any preceding embodiment, wherein the step of determining a process correction comprises determining whether said process correction meets a stability threshold.

10. A method according to any preceding embodiment, wherein the step of determining a process correction comprises co-optimizing the process correction in terms of the performance parameter and the expected stability.

11. A method according to any preceding embodiment, wherein the step of determining a process correction further comprises taking into account residual control potential for preventing future unstable behavior and/or reacting to future events.

12. A method according to any preceding embodiment, wherein the performance parameter is edge placement error and/or one or more contributors thereto.

13. A method according to embodiment 12, wherein said one or more contributors comprise one or more of: overlay, critical dimension, critical dimension uniformity, line width roughness.

14. A method according to embodiment 12 or 13, wherein the process correction is implemented in terms of controlling one or more control components, each corresponding to one of said one or more contributors.

15. A method according to embodiment 14, wherein each of said one or more control components are further divided in terms of an apparatus of the manufacturing process to which it relates.

16. A method according to any preceding embodiment, wherein said one or more control parameters comprise one or more parameters relating to a lithographic apparatus used in the manufacturing process and/or one or more parameters relating to another processing apparatus used in the manufacturing process.

17. A method according to any of embodiments 1 to 16, wherein said process correction comprises a co-optimized process correction for a lithographic apparatus used in the manufacturing process and another processing apparatus used in the manufacturing process.

18. A method according to any preceding embodiment, wherein the step of determining a process correction comprises determining a metrology strategy for obtaining further performance data, based on said expected stability.

19. A method according to any preceding embodiment, wherein step of determining a process correction for the manufacturing process further comprises determining the process correction based on at least one control characteristic related to one or more combinations of said control parameters.

20. A processing device for controlling a manufacturing process for manufacturing semiconductor devices, the processing device being configured to perform the method of any of embodiments 1 to 19.

21. A semiconductor device manufacturing apparatus comprising:
a lithographic apparatus; and
the processing device of embodiment 20;
wherein said semiconductor device manufacturing apparatus is configured to provide product structures to a substrate in a manufacturing process for manufacturing semiconductor devices.

22. A computer program comprising program instructions operable to perform the method of any of embodiments 1 to 19, when run on a suitable apparatus.

23. A non-transient computer program carrier comprising the computer program of embodiment 22.

24. A method according to embodiment 1, wherein the performance parameter is a tilt related parameter of a feature formed on the substrate and/or one or more contributors thereto.

The breadth and scope of the present invention should not be limited by any of the above-described exemplary embodiments, but should be defined only in accordance with the following claims and their equivalents.

The invention claimed is:

1. A method for controlling a manufacturing process for manufacturing devices, the method comprising:
obtaining performance data indicative of performance of the manufacturing process, the performance data comprising values for a performance parameter across a substrate subject to the manufacturing process; and
determining a process correction for the manufacturing process based on the performance data and at least one control characteristic related to a dynamic behavior of one or more control parameters of the manufacturing process, wherein the determining is further based on an expected stability of the manufacturing process when applying the process correction.

2. The method according to claim 1, wherein a proportional-integral-derivative (PID) controller is used to determine the process correction based on the dynamic behavior of the one or more control parameters.

3. The method according to claim 1, wherein the at least one control characteristic further comprises an achievable correction range of the one or more control parameters.

4. The method according to claim 1, wherein each of the one or more control parameters has a corresponding time-varying response function, and the determining takes into account each of the one or more time-varying response functions.

5. The method according to claim 1, wherein the determining a process correction comprises determining whether the process correction meets a stability threshold.

6. The method according to claim 1, wherein the determining a process correction comprises co-optimizing the process correction in terms of the performance parameter and the expected stability.

7. The method according to claim 1, wherein the determining a process correction further comprises taking into account residual control potential for preventing future unstable behavior and/or reacting to future events.

8. The method according to claim 1, wherein the performance parameter is edge placement error and/or one or more contributors thereto.

9. The method according to claim 8, wherein the one or more contributors comprise one or more selected from: overlay, critical dimension, critical dimension uniformity, and/or line width roughness.

10. The method according to claim 8, wherein the performance parameter comprises one or more contributors to edge placement error and wherein the process correction is implemented in terms of controlling one or more control components, each corresponding to one of the one or more contributors.

11. The method according to claim 10, wherein each of the one or more control components are further divided in terms of an apparatus of the manufacturing process to which it relates.

12. The method according to claim 1, wherein the performance parameter is a tilt related parameter of a feature formed on the substrate and/or one or more contributors thereto.

13. The method according to claim 1, wherein the one or more control parameters comprise one or more parameters relating to a lithographic apparatus used in the manufacturing process and/or comprise one or more parameters relating to another processing apparatus used in the manufacturing process.

14. The method as according to claim 1, wherein the process correction comprises a co-optimized process correction for a lithographic apparatus used in the manufacturing process and another processing apparatus used in the manufacturing process.

15. The method according to claim 1, wherein the determining a process correction for the manufacturing process further comprises determining the process correction based on at least one control characteristic related to one or more combinations of the control parameters.

16. A non-transient computer program carrier comprising instructions, the instructions, upon execution by a computer system, configured to cause the computer system to at least:
  obtain performance data indicative of performance of a manufacturing process for manufacturing devices, the performance data comprising values for a performance parameter across a substrate subject to the manufacturing process; and
  determine a process correction for the manufacturing process based on the performance data and at least one control characteristic related to a dynamic behavior of one or more control parameters of the manufacturing process, wherein the determination of the process correction is further based on an expected stability of the manufacturing process when applying the process correction.

17. The carrier of claim 16, wherein the instructions are further configured to cause the computer system to implement a proportional-integral-derivative (PID) controller to determine the process correction based on the dynamic behavior of the one or more control parameters.

18. The carrier of claim 16, wherein the at least one control characteristic further comprises an achievable correction range of the one or more control parameters.

19. The carrier of claim 16, wherein each of the one or more control parameters has a corresponding time-varying response function, and the instructions are further configured to cause the computer system to determine the process correction taking into account each of the one or more time-varying response functions.

20. The carrier of claim 16, the instructions are further configured to cause the computer system to determine whether the process correction meets a stability threshold.

* * * * *